United States Patent [19]

Mower et al.

[11] Patent Number: 4,839,603

[45] Date of Patent: Jun. 13, 1989

[54] MULTIPLE-LOOP MICROWAVE FREQUENCY SYNTHESIZER USING TWO PHASE LOCKLOOPS

[75] Inventors: Vaughn L. Mower, Bountiful; Evan A. Deneris, Salt Lake City; John B. Cox, West Bountiful, all of Utah

[73] Assignee: Unisys Corporation, Blue Bell, Pa.

[21] Appl. No.: 100,400

[22] Filed: Sep. 24, 1987

[51] Int. Cl.[4] .................. H03B 19/00; H03L 7/00
[52] U.S. Cl. ................................. 328/14; 328/15; 331/2; 331/22
[58] Field of Search ................ 328/14, 15, 16, 17; 331/2, 22, 19

[56] References Cited

U.S. PATENT DOCUMENTS

| | | |
|---|---|---|
| 4,528,522 | 7/1985 | Matsuura ............................. 331/2 |
| 4,551,689 | 11/1985 | Scala et al. ......................... 331/2 |
| 4,602,225 | 7/1986 | Miller et al. ........................ 331/2 |
| 4,603,304 | 7/1986 | Burns et al. ........................ 331/2 |
| 4,720,688 | 1/1988 | Haegawa et al. .................... 331/2 |

Primary Examiner—Stanley D. Miller
Assistant Examiner—Richard Roseen
Attorney, Agent, or Firm—John B. Sowell; Mark T. Starr; Thomas J. Scott

[57] ABSTRACT

A multiple-loop microwave frequency synthesizer is provided with an upper and a lower phased-lock loop. The phased-lock loops are mutually connected to a novel sampling mixer and their outputs are connected to an up-converter for providing microwave frequency generated signals. The phased-lock loops are provided with a plurality of programmable frequency dividers connected to a processor controller to provide a wide range of adjustable frequencies up to 20 gigahertz at the output of the frequency synthesizer.

12 Claims, 3 Drawing Sheets

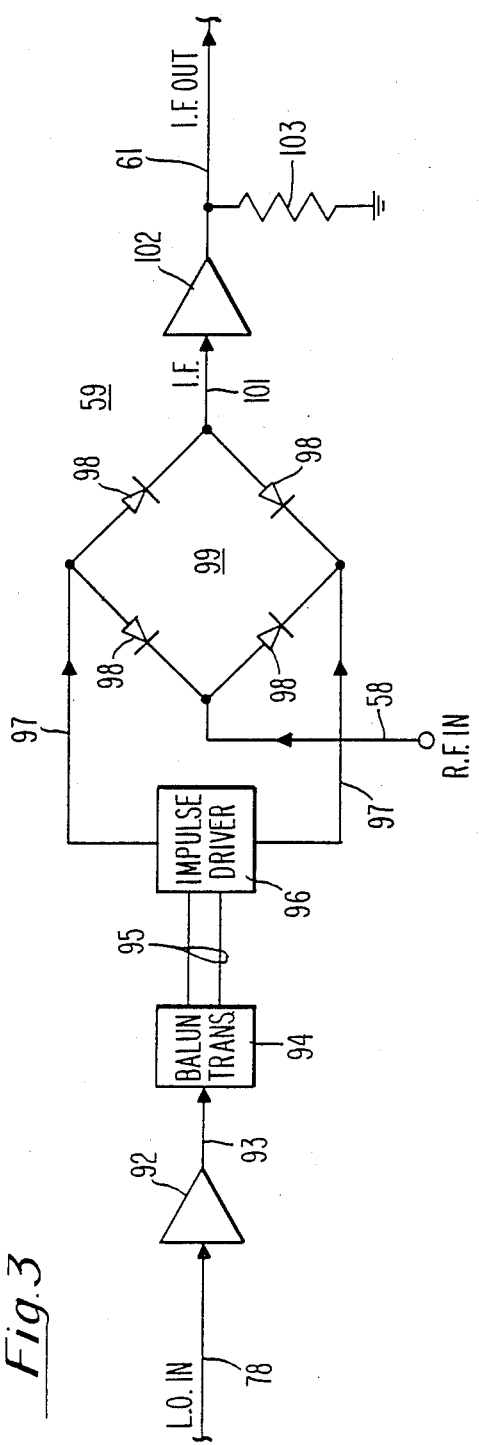
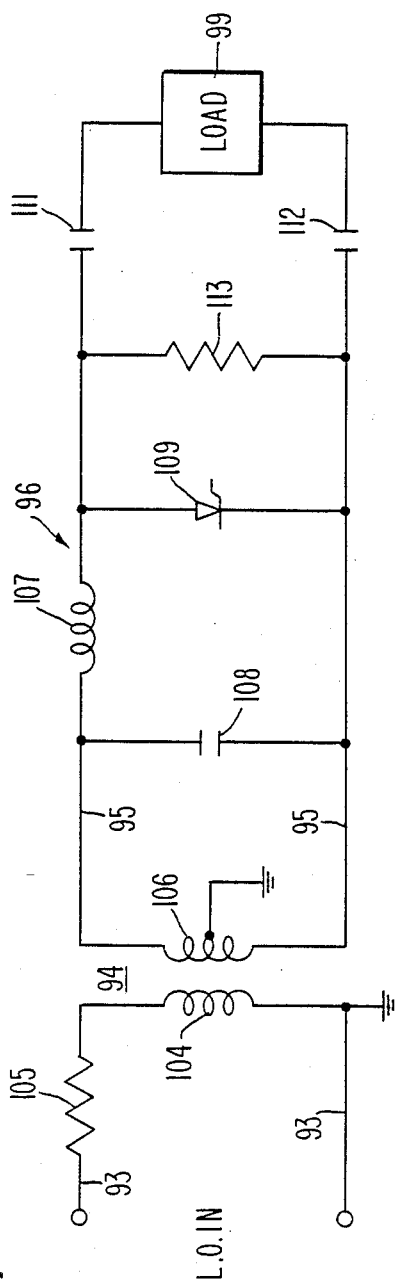
Fig.3
Fig.4

4,839,603

MULTIPLE-LOOP MICROWAVE FREQUENCY SYNTHESIZER USING TWO PHASE LOCKLOOPS

GOVERNMENT CONTRACT RIGHTS

The U.S. Government has a non-exclusive license in this invention adn the right in limited circumstances to require this patent owner to license others on reasonable terms as provided by Federal Acquisition Regulation (FAR-1984 Edition) 52.227-12 entitled "Patent Rights Retention by Contractor".

BACKGROUND OF THE INVENTION

1. Field of the Invention

The present invention relates to phase-locked loop apparatus for producing adjustable microwave frequencies in the range of 7 to 10 gigahertz in steps of 5 to 10 megahertz. More specifically, the present invention relates to a computerized control multiple-loop phase-locked loop circuit employing a novel frequency synthesizer.

2. Description of the Prior Art

Frequency synthesizer systems are known and have been classified in U.S. Class 328, Subclass 14; and in Class 331, Subclasses 16, 22 and 19; and are further classified in International Class H03L 7/18 and 7/22.

Prior art basic linearized phase-locked loops are well known and include a VCO having an output coupled to a divide by N device, a mixer, a phase detector and a low pass filter in the loop and have an external reference frequency applied to the phase detector so that deviations of the VCO from the reference frequency cause the phase detector to generate an error voltage which when applied to the VCO adjust the VCO frequency to match the referencve frequency.

Multiple-loop phase-lock loops are known and have been employed in frequency synthesizing systems, however, such systems have heretofore been relatively complex, employed a plurality of N identical digit modules and complex circuitry similar to that set forth in U.S. Pat No. 4,626,787 and references discussed therein.

There is an unmet requirement for simple, low power, broad range frequency synthesizer which is capable of operating in the microwave frequency range. The frequency synthesizer apparatus needs to be compact, of light weight and easily controlled by a remote processor controller over small steps without the requirement of hardware modifications.

SUMMARY OF THE INVENTION

It is a principal object of the present invention to provide a novel synthesized microwave frequency generator for generating frequencies up to 20 gigahertz.

It is another principal object of the present invention to provide a synthesized microwave frequency generator having computer control steps of about 5 megahertz.

It is another principal object of the present invention to provide a multiple-loop microwave frequency synthesizer controllable by a processor controller for programmably setting frequency dividers.

It is another general object of the present invention to provide a high stability microwave frequency synthesizer having a relatively low frequency stable reference voltage generator for its base frequency.

It is yet another general object of the present invention to provide a novel sampling mixer circuit for utilization in a multi-loop microwave frequency synthesizer system.

It is general object of the present invention to provide an economical, lightweight microwave frequency synthesizer system.

According to these and other objects of the present invention there is provided a frequency synthesizer comprising a phase-locked loop system having an upper and a lower phase-locked loop and a novel sampler mixer mutually connected in the feedback path of the upper phase-locked loop and in the output path of the lower phase-locked loop. A plurality of programmable frequency dividers are connected in the upper and the lower phase-locked loop which are computer controlled to provide a wide range of adjustable frequencies up to about 20 giagahertz at the output of the synthesizer.

BRIEF DESCRIPTION OF THE DRAWINGS

FIG. 3 is a schematic block diagram of the present invention microwave sampling mixer employed in the circuit of FIG. 2; and FIG. 4 is a more detailed schematic block diagram of the balun transformer and the impulse driving circuit of FIG. 3.

DESCRIPTION OF THE PREFERRED EMBODIMENT

Figure 1:
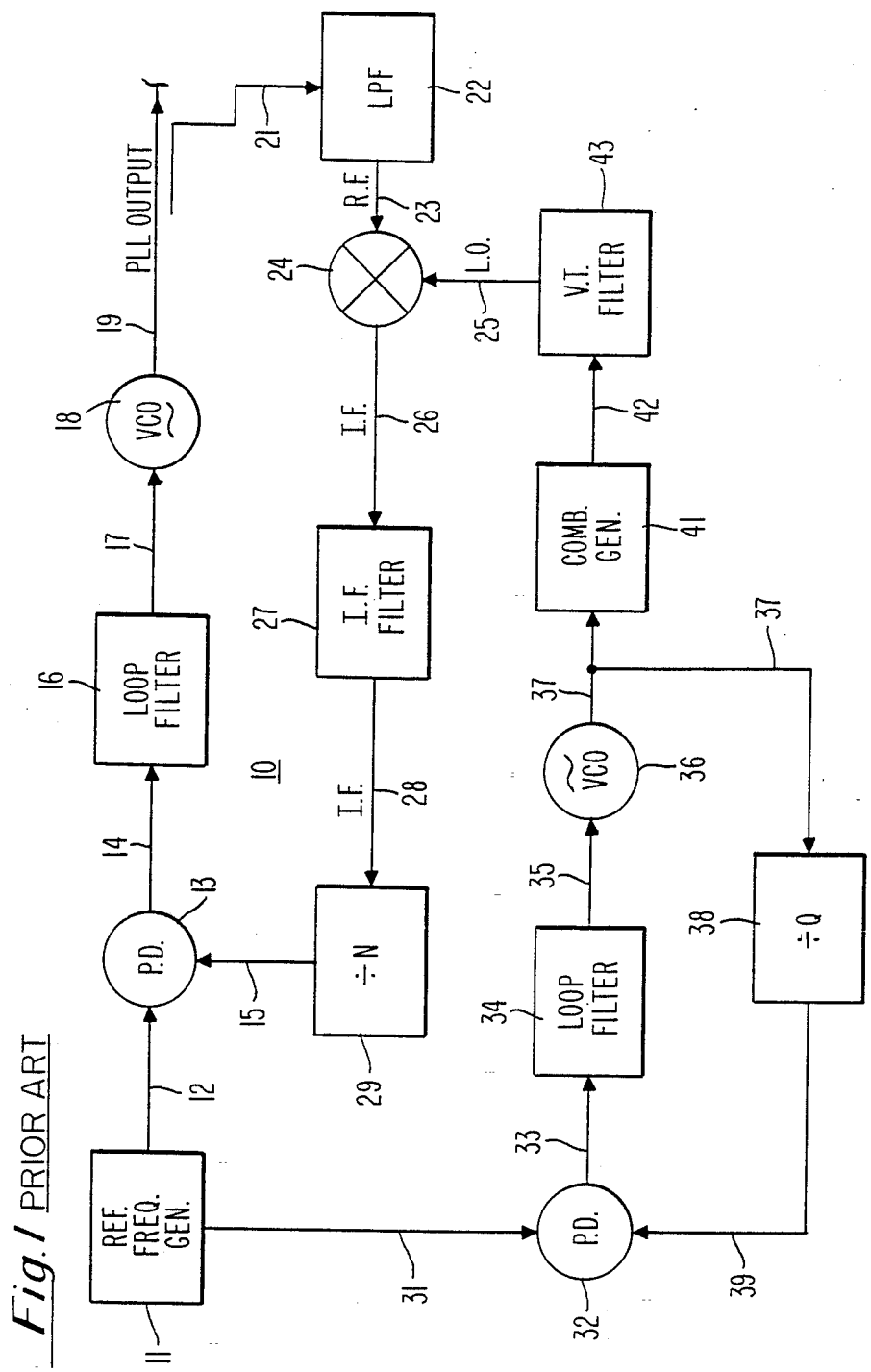
FIG. 1 is a schematic block diagram of a prior art multiple-loop phase-locked loop circuit of the type employed to generate frequencies up to about 500 megahertz.

Refer now to FIG. 1 showing a prior art multiple-loop phase-locked loop circuit of the type employed to generate frequencies up to about 500 magahertz. Generator 10 comprises a reference frequency generator 11 for generating frequencies on line 12 which are applied to the phase detector 13 to produce an output signal on line 14. The output signal on line 14 is an error signal produced by the comparison of the reference frequency signal on line 12 and the VCO signal on line 15. The error signal is applied to loop filter 16 to process and amplify the signal and produce an output on line 17 which drives the voltage controlled oscillator (VCO) 18. The locked oscillator 18 output signal on line 19 is coupled to line 21 and is applied as an input via line 21 to the low pass filter 22 which eliminates harmonics and noise from the RF signal on line 23. The RF signal on line 23 is applied to mixer 24 along with the local oscillator input on line 25 to produce an IF output on line 26. The IF output on line 26 is filtered in IF filter 27 to eliminate spurious output signals of the mixer 24 and to provide a clean IF signal on line 28 which is applied to the divide by N circuit 29.

The reference frequency generator signal on line 31 is applied to the phase detector 32 in the lower loop. The output of the phase detector on line 33 is applied to the loop filter 34 to produce the aforementioned error signal on line 35 which is applied to the voltage controlled oscillator 36 to produce the phase-locked loop output signal on line 37 which is applied to a diide by Q circuit 38 to produce the voltage control oscillator signal on line 39 from the lower frequency VCO 36 in the lower loop. For purposes of this discussion the elements 32 through 39 comprise the lower loop. The output of the lower loop voltage control oscillator on line 37 is applied to the comb generator 41 that produces harmonics of the voltage controlled oscillator 36 on line 42 which are applied to the voltage tuned filter 43 to produce the local oscillator (LO) output signal on line 25.

Employing the state of the art commercially available devices and using the highest frequency voltage controlled oscillator 18 the output of this prior art circuit is limited to about 5 gigahertz when employing gallium arsenside voltage controlled oscillator technology.

Figure 2:
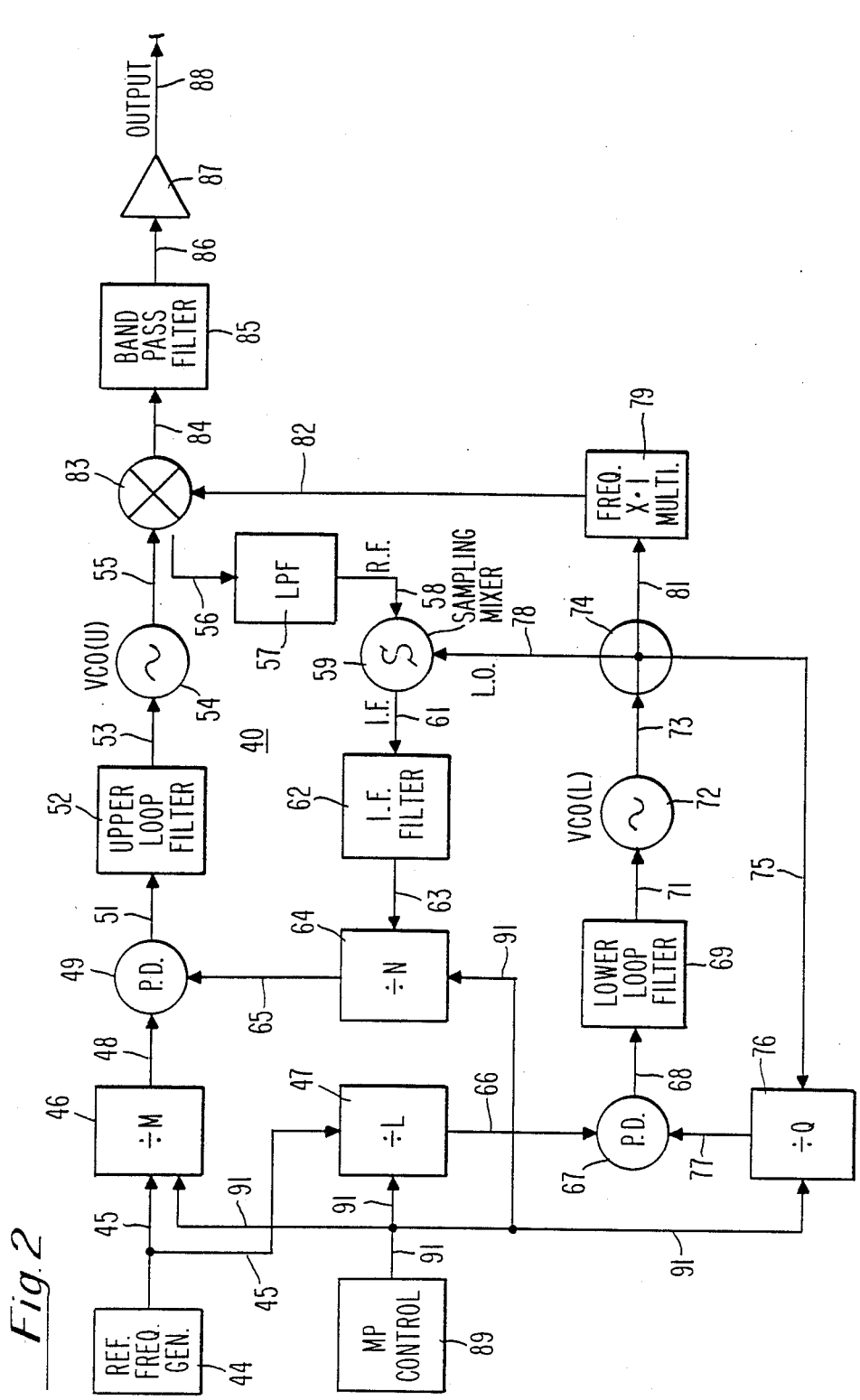
FIG. 2 is a schematic block diagram with the present invention multiple-loop phase-locked loop circuit for generating adjustable microwave frequencies up to about 20 gigahertz.

Refer now to FIG. 2 showing a schematic block diagram of a multiple-loop phase-locked loop circuit 40 for generating frequencies up to 20 gigahertz. The synthesizer circuit or system 40 comprises a reference frequency generator 44 selected for the highest stable frequency which is presently limited to approximatly 200 megahertz employing ECL technology. The output of the reference frequency generator is applied via line 45 to a divide by L circuit 46 and to a divide by M circuit 47 for producing the pre-determined and desired output step frequency on line 48. The stable step frequency is preferably approximately 5 megahertz but may be any desired step obtainable by dividing the reference frequency by an integer. Phase detector 49 produces an error signal on line 51 which is applied to upper loop filter 52 to produce a processed error signal on line 53. The error signal on line 53 adjusts and controls voltage controlled oscillator 54 to produce the locked VCO frequency output on line 55. The VCO signal on line 55 is coupled to line 56 to provide a coupled VCO output signal to low pass filter 57 which produces the RF frequency signal on line 58. The RF signal on line 58 is applied to the present invention sampling mixer 59 to produce an IF output on line 61 which is applied to the IF filter 62 to produce a clean IF signal on line 63. The clean IF signal on line 63 is applied to the programmable divide by N circuit 64 to produce the upper VCO signal on line 65 that is applied to the phase detector 49 to produce an error signal on line 51. The upper loop in the present invention comprises the elements 49 through 65 and the programmable divide by M circuit 46.

The lower loop of the present invention comprises the programmable divide by L circuit 47 which produces the step down reference frequency generator signal on line 66 which is applied to the phase detector 67 to provide an error signal on line 68 which is applied to loop filter 69 to produce the voltage error signal on line 71. The voltage error signal on line 71 adjustably controls the lower voltage control oscillator 72 to produce the locked VCO signal on line 73 which is hard-wired connected to a node 74. Output 75 line connects node 74 to a programmable divide by Q circuit 76 whose output on line 77 is connected to the phase detector 67 completing the lower loop comprising elements 67 through 77.

The locked lower loop VCO signal on line 78 is applied as a LO signal to the sampling mixer circuit 59 and to a frequency multiplier 79 via line 81. Preferably the multiplier 79 is selectable over a range of integers depending on the output frequency range desired. The output of the multiplier 79 on line 82 is applied to mixer 83 along with the upper loop voltage controlled oscillator output signal on line 55 to produce the sum of the two input frequencies on line 84. The higher sum frequency from mixer 83 is applied to a band pass filter 85 to eliminate the difference frequency and provide a clean signal line 86 which is processed and amplified by amplifier 87 to provide the desired output microwave frequency on line 88. The elements 83 to 87 are commonly referred to as an up-converter because they produce the sum frequency of the two lower input frequencies rather than the difference frequencies.

Microprocessor controller 89 preferably comprises an inexpensive microprocessor chip combined with a programmable read only memory which produces output signals on bus 91 capable of setting the programmable divider circuits 46, 47, 54 and 76. In the preferred embodiment synthesizer circuit 40, the divide by L and M circuits 46 and 47 extend the range of tunable frequencies beyond those heretofore obtained in the prior art. The synthesizer circuit 40 is operable without the extended range divider circuits 46 and 57 but since all other components of the circuit are present they do not penalize the cost of the preferred embodiment circuit. Even if circuits 46 and 47 are set an an integer of one, so as to eliminate them functionally from the circuit, the system 40 is still operable.

Refer now to FIG. 3 showing a more detailed schematic block diagram of the novel sampling mixer circuit 59 of FIG. 2. The sampling mixer circuit 59 is shown having the local oscillator input line 78, the RF input line 58 and the IF output 61 connected thereto as shown in FIG. 2. The local oscillator signal on line 78 is applied to amplifier 92 to produce the amplified signal on line 93 applied to balun transformer 94. The dual outputs 95 from balun 94 are applied to the impulse driving circuit 96 to produce dual outputs on line 97 which are applied to the load 99 in the form of a diode bridge comprising microwave diodes 98. The output of the load 99 on line 101 is the IF signal which is amplified and processed in amplifier 102 to produce the desired IF signal on line 61 as described hereinbefore. The line 61 is provided with a matched impedance resistor 103 to prevent reflections on IF line 61.

Refer now to FIG. 4 which is a more detailed detailed schematic block diagram of the balun transformer and the impulse circuit of FIG. 3. The local oscillator signal on lines 93 is applied to the primary winding 104 of balun transformer 94 via resistor 105. The center tapped secondary winding 106 of the balun 94 provides balance signals on lines 95. Inductance 107 and capacitor 108 provide means for impedance matching the signal on lines 95 to the step recovery diode 109. The step recovery diode 109 generates a sharp on/off transition in response to the local oscillator input at lines 93 and the impulse signal is applied to the load 99 through the coupling capacitors 111 and 112. Resistor 113 provides a DC return path for the step recovery diode 109.

Having explained a preferred embodiment sampling mixer mixer circuit for use in a multiple-loop phase-locked loop circuit it will be understood that a high stability output frequency can be generated which can also be upconverted to provide high stability microwave frequencies. Further, it will be understood that employing the present invention synthesizer circuit 40 that the frequencies of the voltage controlled oscillators in the lower loop and the upper loop may be extended to provide the desirable microwave frequencies as well as being employed to cover the range of frequencies covered by prior art devices.

What is claimed is:

1. Apparatus for generating adjusable microwave frequencies of the type having an upper phased-locked loop and a lower phased-lock loop with individual outputs and inputs characterized in that:

said upper phased-lock loop and said lower phased-lock loop each having a feedback path.

a sampling mixer circuit connected in said feedback path of the upper phased-lock loop and connected at the output of the lower phased-lock loop, and upconverting means connected to said output of the upper phased-lock loop and to the output of the lower phased-lock loop to provide an adjustable microwave frequency output from the upconverter.

2. Apparatus as set forth in claim 1 wherein said sampling mixer circuit comprises a microwave frequency diode bridge.

3. Apparatus as set forth in claim 2 wherein said sampling mixer circuit further comprises a high speed impulse circuit coupled to switch said diode bridge ON and OFF.

4. Apparatus as set forth in claim 3 wherein said sampling mixer circuit is switched by a signal produced from the output of the lower phased-lock loop.

5. Apparatus as set forth in claim 4 wherein said switching diode bridge provides a sample of the output of the upper phased-lock loop to the feedback path of the upper phased-lock loop.

6. Apparatus as set forth in claim 1 wherein said upconverter means comprises a mixer coupled to the output of said phased-lock loops.

7. Apparatus as set forth in claim 6 which further includes a frequency multiplier connected in series between the output of the lower phased-lock loop and the upconverter means.

8. Apparatus as set forth in claim 1 wherein said upper phased-lock loop comprises a pair of programmable frequency dividers coupled to a phase detector of said phase-locked loop.

9. Apparatus as set forth in claim 8 wherein said lower phased-lock loop comprises a pair of programmable frequency dividers coupled to a phase detector of said phase-locked loop.

10. Apparatus as set forth in claim 9 which further includes a processor controller for adjusting the frequency division of said programmable frequency dividers.

11. Apparatus as set forth in claim 1 which further includes a low frequency reference generator coupled to the inputs of said phase-locked loops for producing a high stability output microwave frequency signal.

12. Apparatus for generating adjustable microwave frequencies comprising:

an upper phased-lock loop having a high reference frequency generator input and a base frequency output, a sampling mixer coupled to the output of said upper phased-lock loop having an I.F. frequency output, a lower phased-lock loop having a low frequency voltage controlled oscillator output coupled to said sampling mixer to provide a sampling drive frequency, an upconverter coupled to the outputs of said upper and said lower phased-lock loops for providing a stepped up base frequency output, and a pair of computer programmable divide by N devices in said upper and said lower phased-lock loops coupled to a phase detectors of said phase-locked loops for adjustably setting said adjustable microwave frequencies.

* * * * *